United States Patent
Seok et al.

(10) Patent No.: US 9,356,352 B2
(45) Date of Patent: May 31, 2016

(54) WAVEGUIDE COUPLER

(71) Applicant: Texas Instruments Incorporated, Dallas, TX (US)

(72) Inventors: Eunyoung Seok, Plano, TX (US); Srinath Ramaswamy, Murphy, TX (US); Brian B. Ginsburg, Allen, TX (US); Vijay B. Rentala, Plano, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 414 days.

(21) Appl. No.: 13/657,615

(22) Filed: Oct. 22, 2012

(65) Prior Publication Data
US 2014/0111394 A1  Apr. 24, 2014

(51) Int. Cl.
*H01Q 9/04* (2006.01)
*H01P 5/107* (2006.01)

(52) U.S. Cl.
CPC ........ *H01Q 9/04* (2013.01); *H01P 5/107* (2013.01); *Y10T 29/49016* (2015.01)

(58) Field of Classification Search
USPC .......................................... 343/755, 781, 705
See application file for complete search history.

(56) References Cited

U.S. PATENT DOCUMENTS

| | | | |
|---|---|---|---|
| 7,190,315 B2 * | 3/2007 | Waltho | H01Q 1/28 343/705 |
| 8,674,892 B2 * | 3/2014 | Leiba | H01P 3/121 343/755 |
| 2005/0116788 A1 | 6/2005 | Matters-Kammerer et al. | |
| 2008/0309577 A1 | 12/2008 | Mittleman et al. | |
| 2009/0224995 A1 * | 9/2009 | Puente | H01Q 1/42 343/850 |
| 2010/0001906 A1 | 1/2010 | Akkermans et al. | |
| 2011/0181373 A1 | 7/2011 | Kildal | |
| 2011/0309899 A1 | 12/2011 | Leiba et al. | |
| 2012/0187511 A1 | 7/2012 | Maurer et al. | |

FOREIGN PATENT DOCUMENTS

| | | |
|---|---|---|
| KR | 1020060071388 A | 6/2006 |
| WO | WO2011030277 | 3/2011 |

OTHER PUBLICATIONS

"Sub-Wavelength Elliptical Patch Antenna Loaded With μ-Negative Metamaterials," IEEE Transactions on Antennas and Propagation, vol. 58, No. 9, Sep. 2010, pp. 2909-2919 (Chen, et al.).

(Continued)

*Primary Examiner* — Dameon E Levi
*Assistant Examiner* — Walter Davis
(74) *Attorney, Agent, or Firm* — Gregory J. Albin; Frank D. Cimino

(57) ABSTRACT

An apparatus is provided. In the apparatus, there is an antenna package and an integrated circuit (IC). A circuit trace assembly is secured to the IC. A coupler (with an antenna assembly and a high impedance surface (HIS)) is secured to the circuit trace assembly. An antenna assembly has a window region, a conductive region that substantially surrounds the window region, a circular patch antenna that is in communication with the IC, and an elliptical patch antenna that is located within the window region, that is extends over at least a portion of the circular patch antenna, and that is in communication with the circular patch antenna. The HIS substantially surrounds the antenna assembly.

14 Claims, 11 Drawing Sheets

(56) References Cited

OTHER PUBLICATIONS

"Probe Based Radiation Pattern Measurements for Highly Integrated Millimeter-Wave Antennas," Antennas and Propagation (EuCAP), 2010 Proceedings of the Fourth European Conference on, vol., No., pp. 1-5, Apr. 12-16, 2010 (Beer, et al.).

"Progress Towards art Integrated 380 GHz Planar Schottky Diode Heterodyne Receiver on Single Substrate," 18th International Symposium on Space Terahertz Technology ISSTT2007, Caltech, Pasadena, CA, SA, Mar. 2007, pp. 292-295.

U.S. Appl. No. 13/116,885.

\* cited by examiner

WAVEGUIDE COUPLER

TECHNICAL FIELD

The invention relates generally to waveguide and, more particularly, to an antenna assembly that couples to a waveguide.

BACKGROUND

Waveguides have been employed in a variety of application, and, as a part of the physics of a waveguide, proper coupling is an important issue. With most low frequency applications, this type of coupling between an antenna and a waveguide can be relatively easily accomplished. However, with high frequency applications (such as millimeter wave or terahertz radiation), coupling can be problematic because the alignment precision can be quite high (and quite costly). Therefore, there is a need for a simpler alignment structure so as to be able to couple an antenna to a waveguide for high frequency applications.

Some examples of conventional systems are: U.S. Patent Pre-Grant Publ. No. 2008/0309577; U.S. Patent Pre-Grant Publ. No. 2011/0309899; PCT Publ. No. WO2011030277; Chen et al., "Sub-Wavelength Elliptical Patch Antenna Loaded With µ-Negative Metamaterials," *IEEE Trans. on Antennas and Propagation*, Vol. 58, No. 9, September 2010, pp. 2909-2919; Beer et al., "Probe Based Radiation Pattern Measurements for Highly Integrated Millimeter Wave Antennas," *Antennas and Propagation (EuCAP)*, 2010*Proceedings of the Fourth European Conference on*, vol., no., pp. 1-5, 12-16 Apr. 2010; and Thomas et al. "Progress towards an integrated 380 GHz planar Schottky diode heterodyne receiver on single substrate," *Proceedings of the 18th International Symp. on Space THz Technology, ISSTT*2007, Caltech, Pasadena, Calif., SA, March 2007.

SUMMARY

In accordance the present invention, an apparatus is provided. The apparatus comprises an integrated circuit (IC); and an antenna package having: a circuit trace assembly that is secured to the IC; a coupler that is secured to the circuit trace assembly, wherein the coupler includes: an antenna assembly having: a window region; a conductive region that substantially surrounds the window region; a circular patch antenna that is in communication with the IC; and an elliptical patch antenna that is located within the window region, that is extends over at least a portion of the circular patch antenna, and that is in communication with the circular patch antenna; and a high impedance surface (HIS) that substantially surrounds the antenna assembly.

In accordance the present invention, the apparatus further comprises an alignment assembly that is secure to the coupler, wherein the alignment assembly includes an opening that is substantially aligned with the window region.

In accordance the present invention, the apparatus further comprises a waveguide that is secured to the alignment assembly.

In accordance the present invention, the waveguide is substantially rectangular.

In accordance the present invention, the circular patch antenna further comprises first and second circular patch antennas that are symmetrically aligned with one another.

In accordance the present invention, the elliptical patch antenna further comprises first and second elliptical patch antennas that are symmetrically aligned with one another, wherein each of the first and second elliptical patch antennas is located within the window region, and wherein the first and second elliptical patch antennas respectively extend over portions of the first and second circular patch antennas, and wherein the first and second elliptical patch antennas are respectively in communication with the first and second circular patch antennas.

In accordance the present invention, a method is provided. The method comprises forming a first metallization layer over the substrate such that the first metallization layer includes first and second circular patch antennas that are symmetrically aligned with one another; forming a second metallization layer over the first metallization layer, wherein the second metallization layer has first, second, and third portions, and wherein the first and second portions of the second metallization layer are in communication with the first and second patch antennas, respectively; forming a third metallization layer over the second metallization layer, wherein the third metallization layer has first, second, and third portions, and wherein the first, second, and third portions of the third metallization layer are in communication with the first, second, and third portions of the second metallization layer, respectively; and forming a fourth metallization layer over the third metallization layer, wherein the fourth metallization layer has first, second, and third portions, and wherein the first, second, and third portions of the fourth metallization layer are in communication with the first, second, and third portions of the third metallization layer, respectively, and wherein the first and second portions of the fourth metallization layer are located within a opening in the third portion of the fourth metallization layer that defines a window region, and wherein the first and second portions of the fourth metallization layer formed first and second elliptical patch antennas that are symmetrically aligned with one another.

In accordance the present invention, the method further comprises: forming first and second pad on a first side of the substrate; and forming first and second vias that extend from the first side to a second side, wherein the first and second vias are substantially and respectively aligned with the first and second pads, and wherein the first metallization layer is formed over the second side of the substrate.

In accordance the present invention, the method further comprises: forming a first dielectric layer between the first and second metallization layers; and forming third and fourth vias that extend between the first and second metallization layers, wherein the third and fourth vias are in communication with the first and second circular patch antennas, respectively, and wherein the first and second portions of the second metallization layer are in communication with the third and fourth vias, respectively.

In accordance the present invention, the method further comprises: forming a second dielectric layer between the second and third metallization layers; forming fifth and sixth vias that extend between the second and third metallization layers, wherein the fifth and sixth vias are in communication with the first and second portions of the second and third metallization layers, respectively; and forming a set of seventh vias that extend between the second and third metallization layers, wherein the set of seventh vias are in communication with the third portions of the second and third metallization layers.

In accordance the present invention, the method further comprises: forming a third dielectric layer between the third and fourth metallization layers; forming eighth and ninth vias that extend between the third and fourth metallization layers, wherein the eighth and ninth vias are in communication with the first and second portions of the third and fourth metallization layers, respectively; and forming a set of tenth vias that extend between the third and fourth metallization layers, wherein the set of tenth vias are in communication with the third portions of the third and fourth metallization layers.

In accordance the present invention, the method further comprises: securing a circuit trace assembly to the substrate; and securing an IC to the circuit trace assembly.

In accordance the present invention, an apparatus is provided. The apparatus comprising: a circuit board; an IC; an antenna package having: a circuit trace assembly that is secured to the IC and the circuit board; a coupler that is secured to the circuit trace assembly, wherein the coupled includes: an antenna assembly having: a window region; an conductive that substantially surrounds the window region; a first circular patch antenna that is in communication with the IC; a second circular patch antenna that is in communication with the IC, wherein the first and second patch antennas are symmetrically aligned with one another; an first elliptical patch antenna that is located within the window region, that is extends over at least a portion of the first circular patch antenna, and that is in communication with the first circular patch antenna; and an second elliptical patch antenna that is located within the window region, that is extends over at least a portion of the second circular patch antenna, and that is in communication with the second circular patch antenna, and wherein the first and second elliptical patch antenna are symmetrically aligned with one another; and an HIS that substantially surrounds the antenna assembly; an alignment assembly that is secured to the coupler, wherein the alignment assembly includes an opening that is substantially aligned with the window region; and a waveguide that is secured to the alignment assembly.

In accordance the present invention, the coupler further comprises: a first metallization layer that is formed over the substrate such that the first metallization layer includes first and second circular patch antennas that are symmetrically aligned with one another; a second metallization layer that is formed over the first metallization layer, wherein the second metallization layer has first, second, and third portions, and wherein the first and second portions of the second metallization layer are in communication with the first and second patch antennas, respectively; a third metallization layer that is formed over the second metallization layer, wherein the third metallization layer has first, second, and third portions, and wherein the first, second, and third portions of the third metallization layer are in communication with the first, second, and third portions of the second metallization layer, respectively; and a fourth metallization layer that is formed over the third metallization layer, wherein the fourth metallization layer has first, second, and third portions, and wherein the first, second, and third portions of the fourth metallization layer are in communication with the first, second, and third portions of the third metallization layer, respectively, and wherein the first and second portions of the fourth metallization layer are located within a opening in the third portion of the fourth metallization layer that defines the window region, and wherein the first and second portions of the fourth metallization layer formed first and second elliptical patch antennas that are symmetrically aligned with one another.

In accordance the present invention, the coupler further comprises: first and second pad that are formed on a first side of the substrate, wherein the first and second pad are secured to the circuit trace assembly; and first and second vias that extend from the first side to a second side, wherein the first and second vias are substantially and respectively aligned with the first and second pads, and wherein the first metallization layer is formed over the second side of the substrate.

In accordance the present invention, the coupler further comprises: a first dielectric layer that is formed between the first and second metallization layers; and third and fourth vias that extend between the first and second metallization layers, wherein the third and fourth vias are in communication with the first and second circular patch antennas, respectively, and wherein the first and second portions of the second metallization layer are in communication with the third and fourth vias, respectively.

In accordance the present invention, the method further comprises: a second dielectric layer that is formed between the second and third metallization layers; fifth and sixth vias that extend between the second and third metallization layers, wherein the fifth and sixth vias are in communication with the first and second portions of the second and third metallization layers, respectively; and a set of seventh vias that extend between the second and third metallization layers, wherein the set of seventh vias are in communication with the third portions of the second and third metallization layers.

In accordance the present invention, the coupler further comprises: a third dielectric layer that is formed between the third and fourth metallization layers; eighth and ninth vias that extend between the third and fourth metallization layers, wherein the eighth and ninth vias are in communication with the first and second portions of the third and fourth metallization layers, respectively; and a set of tenth vias that extend between the third and fourth metallization layers, wherein the set of tenth vias are in communication with the third portions of the third and fourth metallization layers.

In accordance the present invention, the alignment assembly further comprises a plate having a plurality of alignment openings formed therein.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
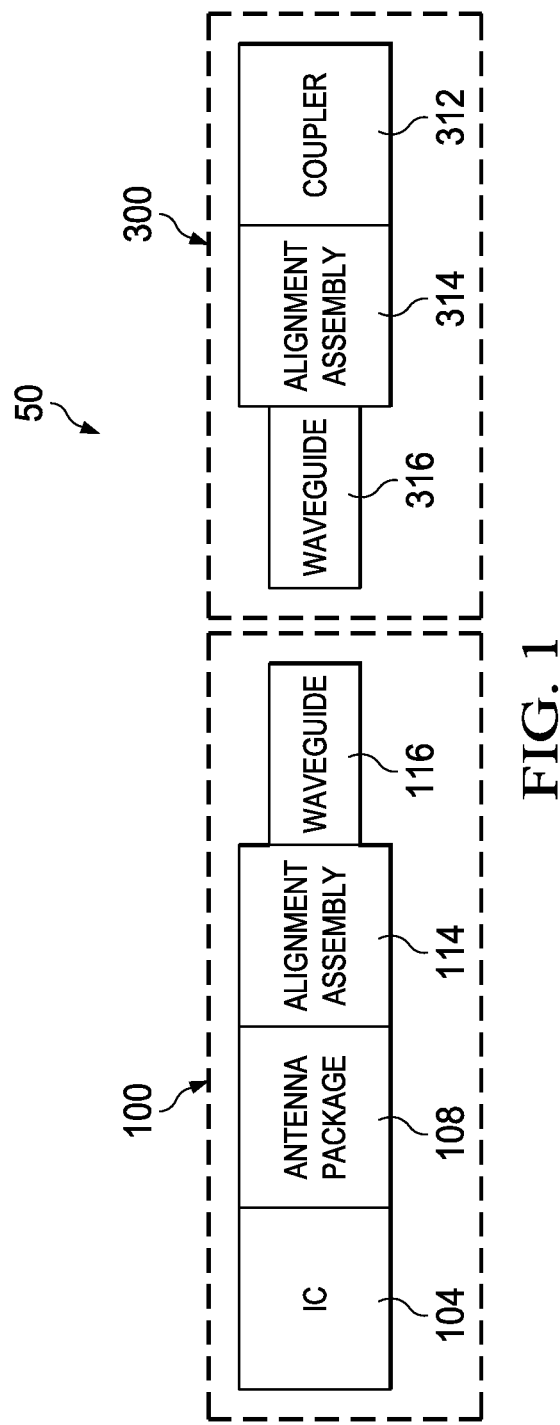
FIG. 1 is a diagram of an example of a communication system in accordance with present invention.
Figure 2:
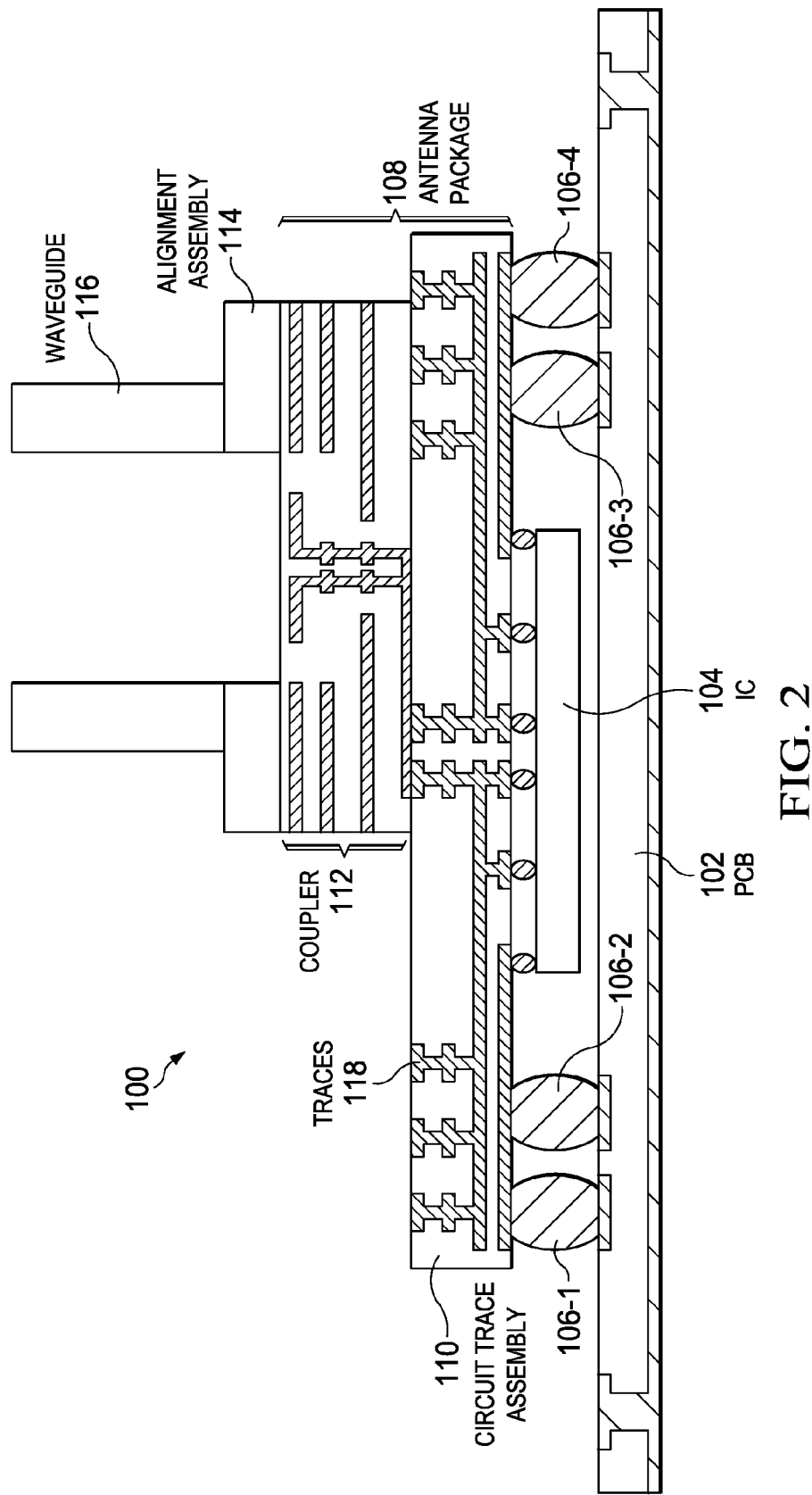
FIG. 2 is a diagram of an integrated circuit (IC)-coupling system of FIG. 1.
Figure 3:
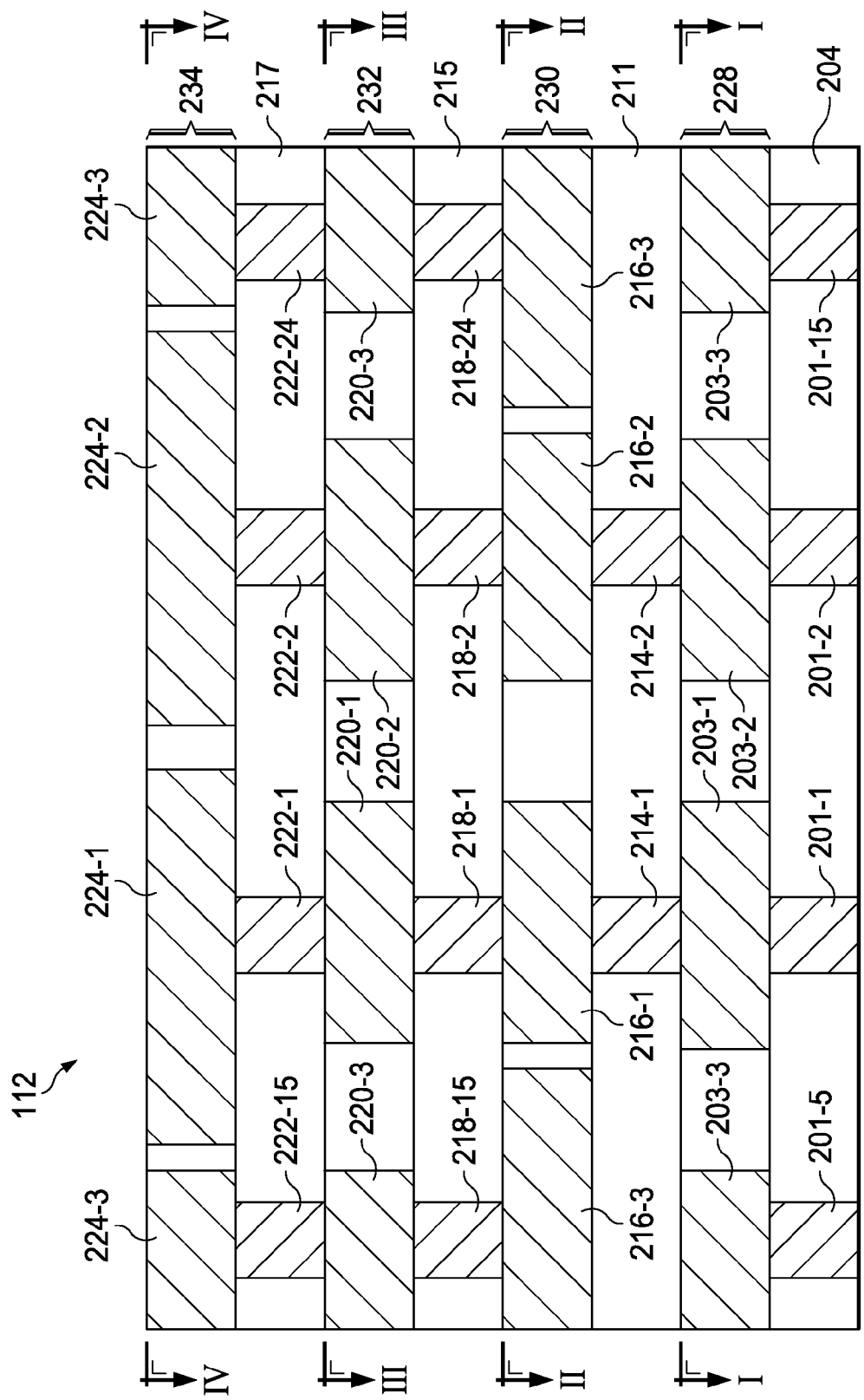
FIG. 3 is a cross-sectional view of an example of the coupler of FIG. 2.
Figure 4:
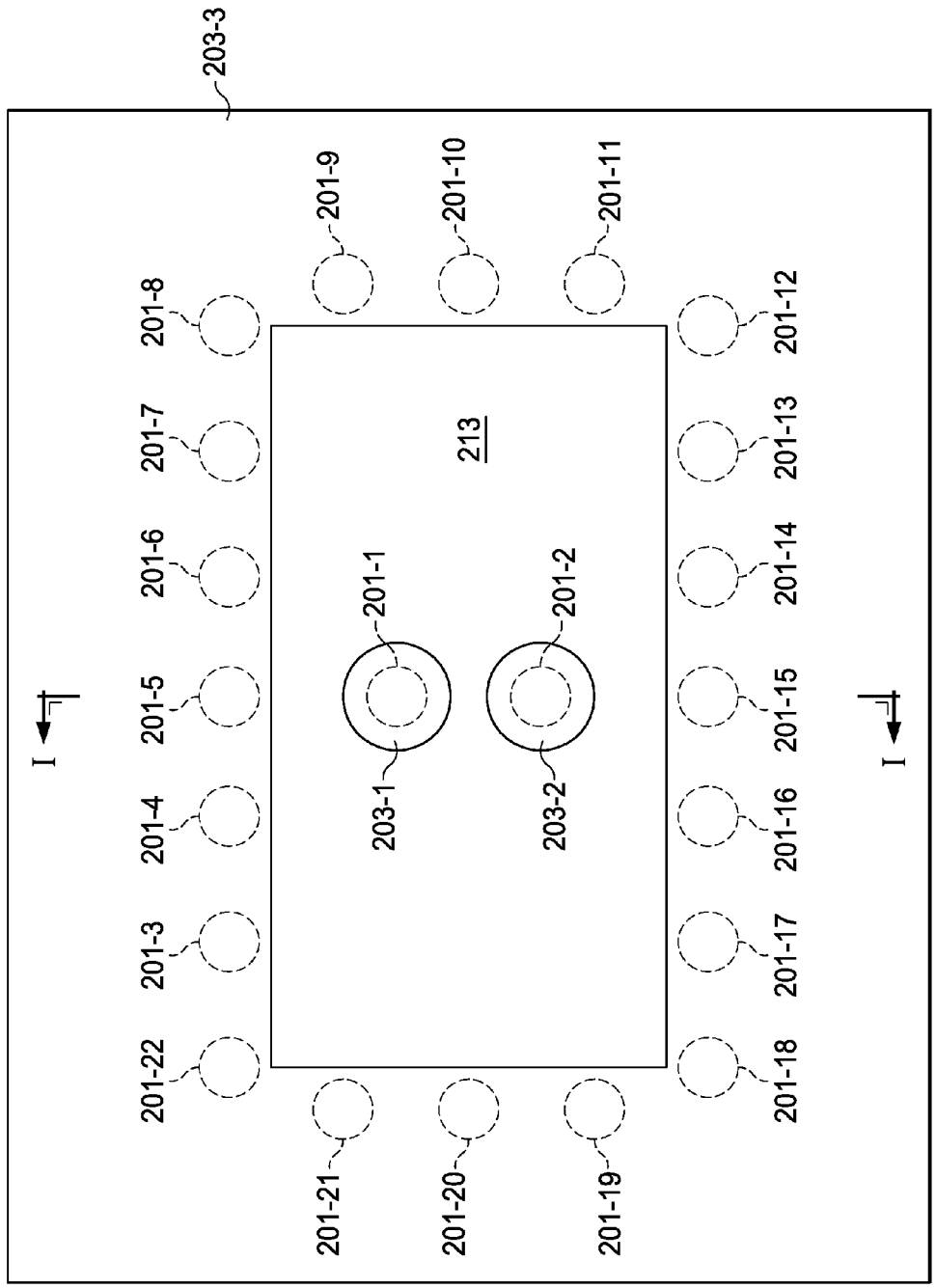
FIGS. 4-7 are plan views of the coupler of FIGS. 2 and 3 along section lines I-I, II-II, III-III, and IV-IV, respectively.
Figure 5:
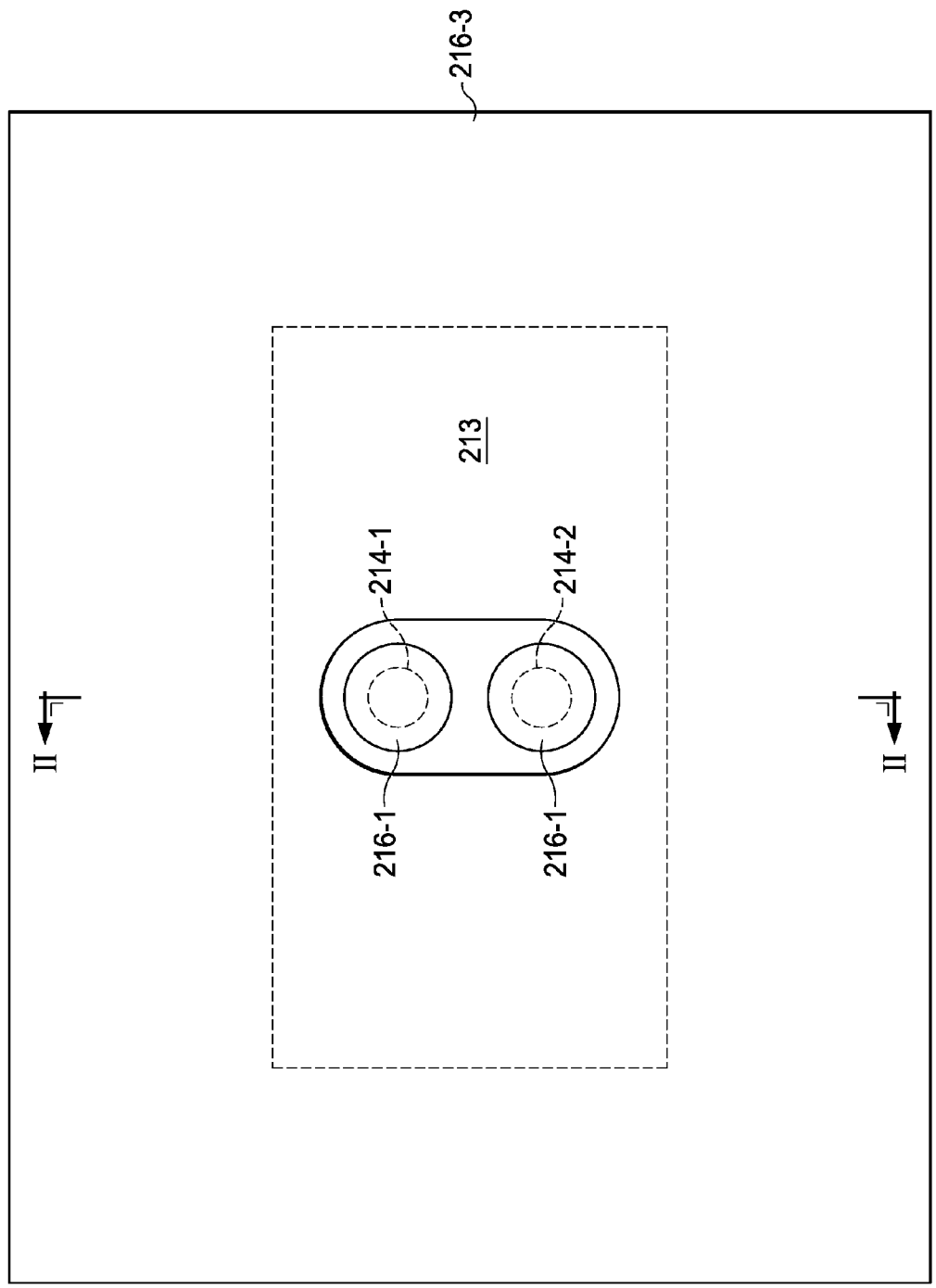
Figure 6:
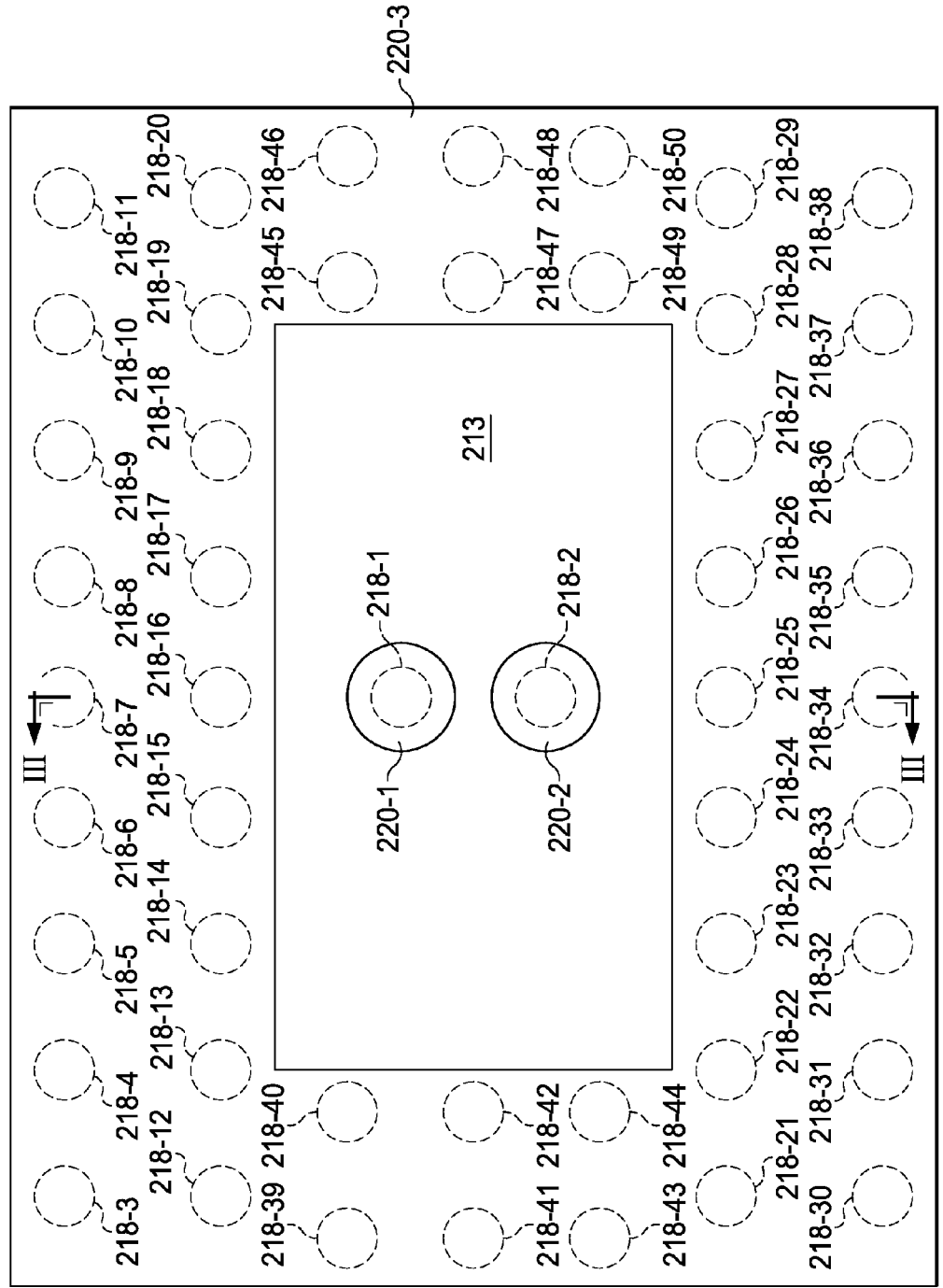
Figure 7:
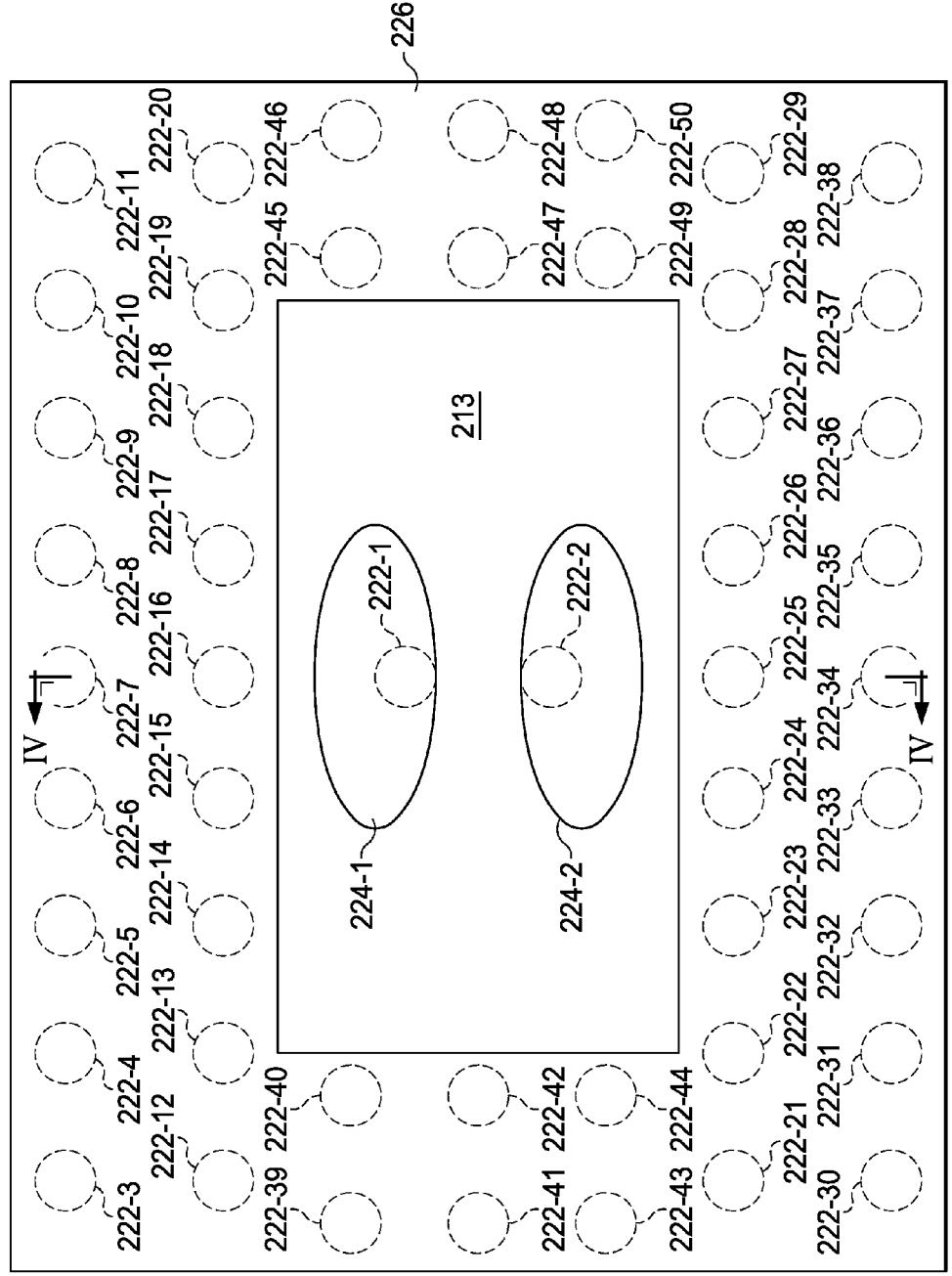
Figure 8:
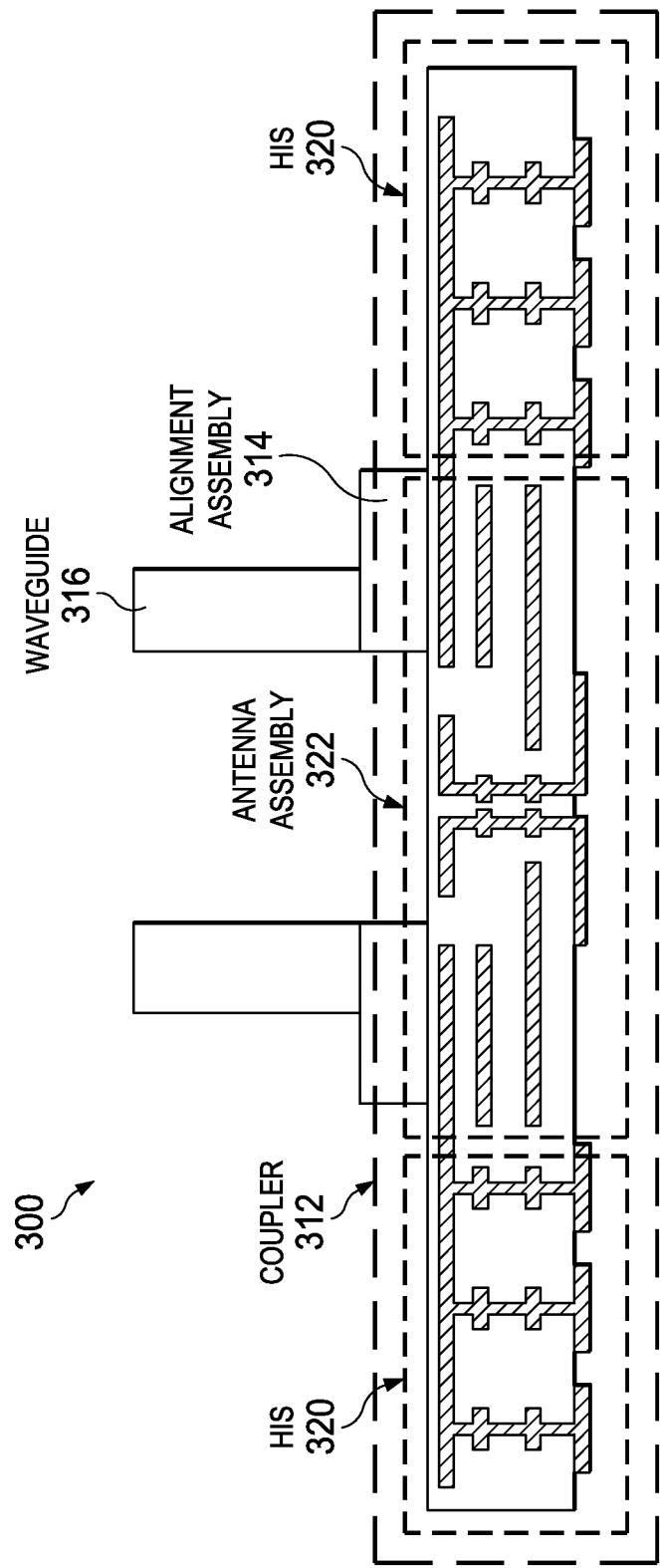
FIG. 8 is a diagram of an example of the air-coupling system of FIG. 1.
Figure 9:
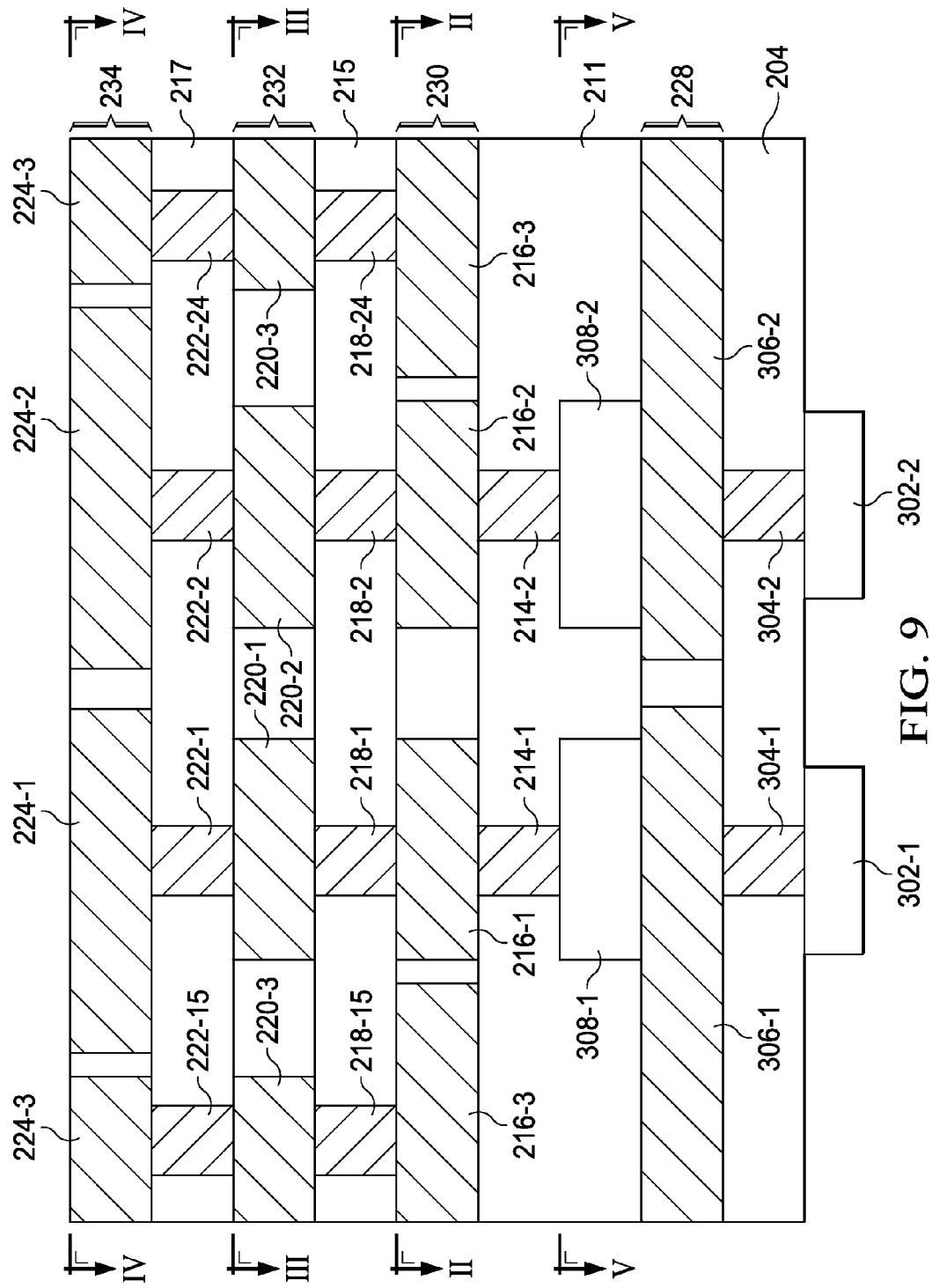
FIG. 9 is a cross-sectional view of the coupler of FIG. 8.
Figure 10:
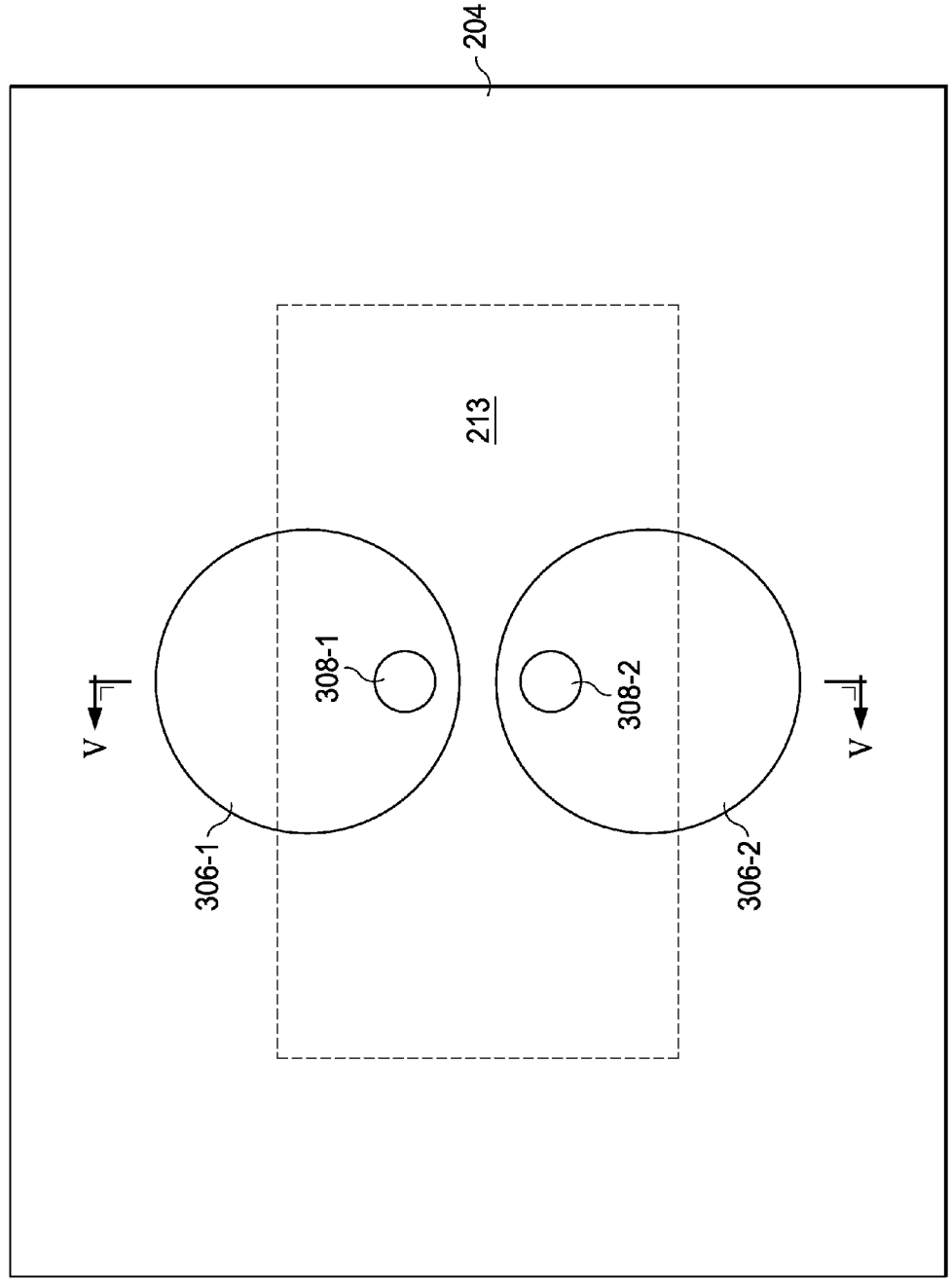
FIG. 10 is a plan view of an example of the coupler of FIGS. 8 and 9 along section line V-V.

Refer now to the drawings wherein depicted elements are, for the sake of clarity, not necessarily shown to scale and wherein like or similar elements are designated by the same reference numeral through the several views.

Turning to FIG. 1, an example system 50 in accordance with the present invention can be seen. As described above, it is difficult to implement waveguides to carry millimeter waves or terahertz radiation, but, in this example, there is an IC-coupling system 100 and an air-coupling system 300. As shown, system 100 generally comprises an IC 104, an antenna package 108, an alignment assembly 114, and a waveguide 116, and system 300 generally comprises a waveguide 316, an alignment assembly 314, and a coupler 312. The details of each of systems 100 and 300 are described below with respect to FIGS. 2-11. Also, system 50 may include a wide variety of configurations, such as waveguides 116 and 316 being a common waveguide, two or more systems 100 communicating with one another, or two or more systems 300 communicating with one another.

Looking first to system 100, an example configuration can be seen in FIGS. 2-7. As shown, the IC 104 (which, for example can be a microprocessor) is able to communicate with other components (not shown) that are secured to the printed circuit board (PCB) 102 and is able to wirelessly communicate. The IC 104 is able to do this by virtue of the circuit trace assembly 110 (which itself may be a PCB or an IC). As shown in this example, this circuit trace assembly 110 (which generally includes traces 118) is secured to both the IC 104 and PCB 102 by solder balls (e.g., 106-1 to 106-4) that provide both a mechanical and electrical coupling. Coupled to the circuit trace assembly 110 is a coupler 112 (where the coupler 112 and circuit trace assembly 110 can collectively be referred to as an antenna package 108). This coupler 112 can be a PCB or an IC that includes an antenna assembly 122 (which can be seen in greater detail in FIG. 2) and a high impedance surface (HIS) 120. An example of an HIS is shown and described in U.S. patent application Ser. No. 13/116,885, which is incorporated by reference herein for all purposes. The antenna assembly 122 is typically dimensioned to transmit and/or receive millimeter wave or terahertz radiation (which can be in a frequency range from about 60 GHz to about 10 THz) and is configured to generate a generally narrow, vertical beam. An aligning plate (e.g., alignment assembly 114) can then be coupled to the coupler 112 so as to align the antenna (e.g., antenna package 108) with the waveguide 116 (which can, for example, be substantially rectangular).

Of interest here, however, is the configuration for the coupler 112. As stated above, the coupler 112 can, for example, be a PCB or an IC, and an example of both the formation and structure of at least a portion of an example of the coupler 112 can be seen in FIGS. 3-7. In this example, an antenna assembly 122 is generally secured to the circuit trace assembly 110 with studs 201-1 to 201-22 (e.g., by way of solder balls). These studs 201-1 and 201-22 are generally formed so as to extend through the substrate 204 to portions 203-1 to 203-3 of metallization layer 228. Portions 203-1 and 203-2 of the metallization layer 228 generally form circular patch antennas that are symmetrically aligned with one another within window region 213. Surrounding the portions 203-1 and 203-2 is portion 203-3 (which is typically grounded). Dielectric layer 211 (which can be formed of one or layers) can be formed over portions 203-1 to 203-3, and vias 214-1 and 214-2 can also be formed through dielectric layer 211 (which can, for example, be formed of silicon dioxide).

As shown in this example, multiple interconnect layers are then employed over the metallization layer 228. Formed over the dielectric layer 211 are metallization layer 230 and dielectric layer 215. This metallization layer 230 has portions 216-1, 216-2, and 216-3. As shown in this example, portions 216-1 and 216-2 are formed within a small window within portion 216-3 so as to function as interconnect pads for portions 210-1 and 210-2 (or circular patch antennas). Similarly, portions 220-1 and 220-2 of metallization layer 232 can function as interconnect pads (which are coupled to portions 216-1 and 216-2 with vias 218-1 and 218-2). Portions 216-3 and 220-3 can also be coupled together using 218-3 to 218-49.

Dielectric layer 217 and metallization layer 234 can then be formed over the metallization layer 232. Portions 224-1 and 224-2 of metallization layer 234 can form elliptical patch antennas (which can, for example, be about 600 µm×250 µm). These elliptical patch antennas are located within window region 213 (which is generally defined by portion 224-3) and are coupled to portions 220-1 and 220-2 by vias 222-1 and 222-2 (respectively). The portion 224-3 can also be coupled to portion 220-3 with vias 222-3 to 222-49 so as to form the conductive region 226 that substantially surrounds the window region 213. By doing this, the elliptical patch antennas (i.e., portions 224-1 and 224-2) can collect the energy from the circular patch antennas (i.e., portions 210-1 and 210-2) and redirect it vertically (e.g., into waveguide 116). Additionally, it should be noted that each of the metallization layers can, for example, be formed of aluminum or copper, and each via can, for example, be formed of tungsten.

Coupler 312 can also have a similar configuration to that of coupler 112. An example of such a coupler can be seen in FIGS. 8-10. As shown in this example, metallization layer 230, 232, and 234 of coupler 312 are arranged in a similar manner to that of the example of coupler 112 shown in FIGS. 3-7. A difference, though, lies in metallization layer 228. In this example, metallization layer 228 is arranged to have portions 306-1 and 306-2. These portions 306-1 and 306-2 can form circular patch antennas (which can, for example, each have a radius of about 580 µm) that extend beyond the window region 213. Vias 304-1 and 304-2 extend through the substrate from portions 306-1 and 306-2 to antennas 302-1 and 302-2. Pad 308-1 and 308-2 can also be formed between portions 306-1 and 306-2 and vias 214-1 and 214-2.

Figure 11:
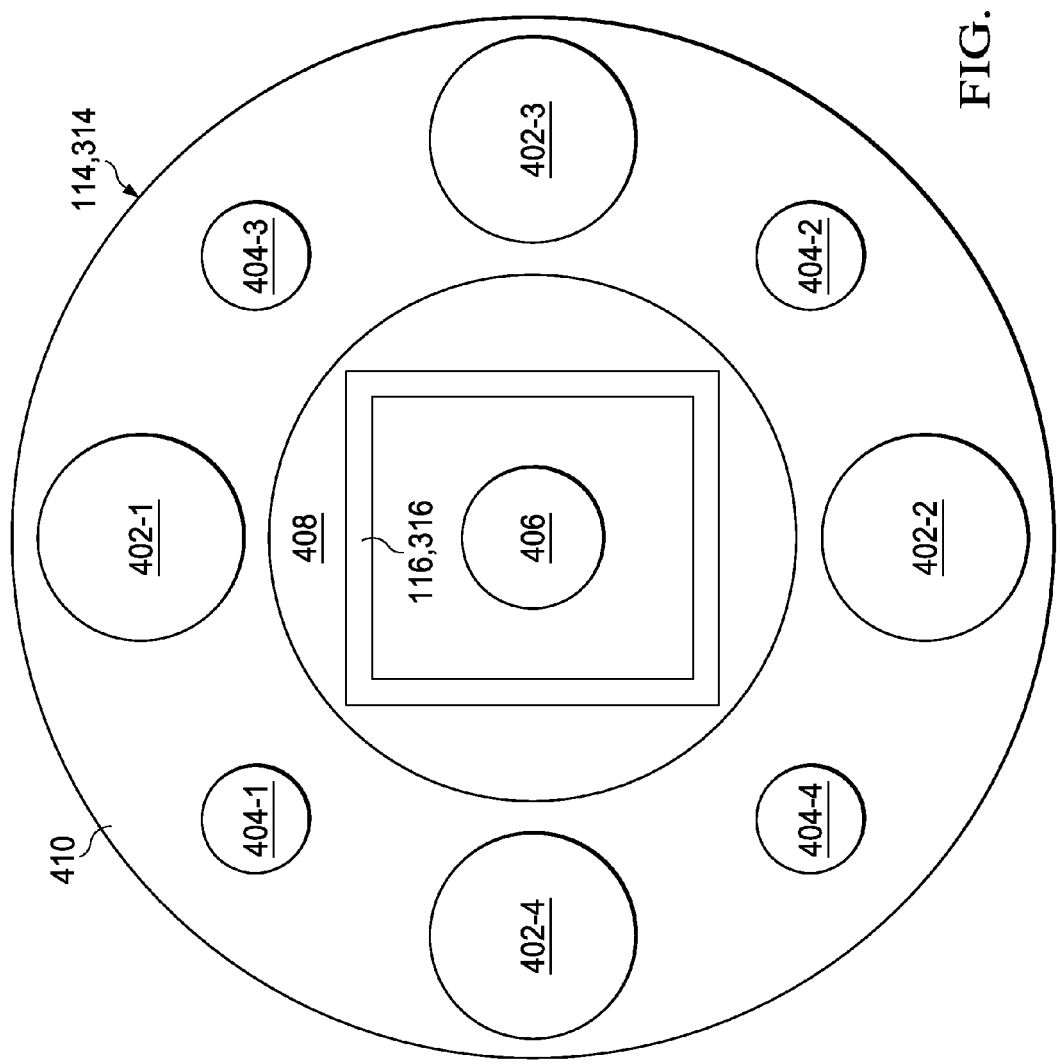
FIG. 11 is a plan view of an example of the alignment assembly and waveguide of FIGS. 2 and 8.

Turning to FIG. 11, a plan view of an example of the alignment assembly 114 and/or 314 and waveguide 116 and/or 316 can be seen. As shown, the alignment assembly 114 and/or 314 can be formed of a circular plate (which can be formed of aluminum or steel) having a ring 410 that substantially surrounds the portion 408. Within ring 410, there are openings 402-1 to 402-4 and 404-1 to 404-4 that extend through the plate and that can be used to secure the alignment assembly 114 or 314 to the coupler 112 or 312, respectively, or to operate as alignment markers. Opening 406 (which is shown as being at the center of portion 408) is generally aligned with the window region 213 in this example.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
an integrated circuit (IC); and
an antenna package having:
  a circuit trace assembly that is secured to the IC; and
  a coupler that is secured to the circuit trace assembly, the coupler including:
    an antenna assembly having:
      a window region;
      a conductive region that substantially surrounds the window region;
      a circular patch antenna that is in communication with the IC; and an elliptical patch antenna that is located within the window region, that extends over at least a portion of the circular patch antenna, and that is in communication with the circular patch antenna; and a high impedance surface (HIS) that substantially surrounds the antenna assembly.

2. The apparatus of claim 1 including an alignment assembly that is secured to the coupler, in which the alignment assembly includes an opening that is substantially aligned with the window region.

3. The apparatus of claim 2 including a waveguide that is secured to the alignment assembly.

4. The apparatus of claim 3, in which the waveguide is substantially rectangular.

5. The apparatus of claim 3, in which the circular patch antenna further includes first and second circular patch antennas that are symmetrically aligned with one another.

6. The apparatus of claim 5, in which the elliptical patch antenna further includes first and second elliptical patch antennas that are symmetrically aligned with one another, in which each of the first and second elliptical patch antennas is located within the window region, in which the first and second elliptical patch antennas respectively extend over portions of the first and second circular patch antennas, and in which the first and second elliptical patch antennas are respectively in communication with the first and second circular patch antennas.

7. An apparatus comprising:
a circuit board;
an integrated circuit (IC);
an antenna package having:
a circuit trace assembly that is secured to the IC and the circuit board;
a coupler that is secured to the circuit trace assembly, the coupler including:
an antenna assembly having:
a window region;
a conductive region that substantially surrounds the window region;
a first circular patch antenna that is in communication with the IC;
a second circular patch antenna that is in communication with the IC, the first and second circular patch antennas being symmetrically aligned with one another;
a first elliptical patch antenna that is located within the window region, that extends over at least a portion of the first circular patch antenna, and that is in communication with the first circular patch antenna; and
a second elliptical patch antenna that is located within the window region, that extends over at least a portion of the second circular patch antenna, and that is in communication with the second circular patch antenna, the first and second elliptical patch antennas being symmetrically aligned with one another; and
a high impedance surface (HIS) that substantially surrounds the antenna assembly;
an alignment assembly that is secured to the coupler, the alignment assembly including an opening that is substantially aligned with the window region; and
a waveguide that is secured to the alignment assembly.

8. The apparatus of claim 7, in which the coupler further includes:
a first metallization layer that is formed over a substrate such that the first metallization layer includes the first and second circular patch antennas that are symmetrically aligned with one another;
a second metallization layer that is formed over the first metallization layer, the second metallization layer having first, second, and third portions, the first and second portions of the second metallization layer being in communication with the first and second patch antennas, respectively;
a third metallization layer that is formed over the second metallization layer, the third metallization layer having first, second, and third portions, and the first, second, and third portions of the third metallization layer being in communication with the first, second, and third portions of the second metallization layer, respectively; and
a fourth metallization layer that is formed over the third metallization layer, the fourth metallization layer having first, second, and third portions, the first, second, and third portions of the fourth metallization layer being in communication with the first, second, and third portions of the third metallization layer, respectively, the first and second portions of the fourth metallization layer being located within an opening in the third portion of the fourth metallization layer that defines the window region, and the first and second portions of the fourth metallization layer forming the first and second elliptical patch antennas that are symmetrically aligned with one another.

9. The apparatus of claim 8, in which the coupler further includes:
first and second pads that are formed on a first side of the substrate, the first and second pads being secured to the circuit trace assembly; and
first and second vias that extend from the first side to a second side of the substrate, the first and second vias being substantially and respectively aligned with the first and second pads, the first metallization layer being formed over the second side of the substrate.

10. The apparatus of claim 9, in which the coupler further includes:
a first dielectric layer that is formed between the first and second metallization layers; and
third and fourth vias that extend between the first and second metallization layers, the third and fourth vias being in communication with the first and second circular patch antennas, respectively, the first and second portions of the second metallization layer being in communication with the third and fourth vias, respectively.

11. The apparatus of claim 10, in which the coupler further includes:
a second dielectric layer that is formed between the second and third metallization layers;
fifth and sixth vias that extend between the second and third metallization layers, the fifth and sixth vias being in communication with the first and second portions of the second and third metallization layers, respectively; and
a set of seventh vias that extend between the second and third metallization layers, the set of seventh vias being in communication with the third portions of the second and third metallization layers.

12. The apparatus of claim 11, in which the coupler further includes:
a third dielectric layer that is formed between the third and fourth metallization layers;

eighth and ninth vias that extend between the third and fourth metallization layers, the eighth and ninth vias being in communication with the first and second portions of the third and fourth metallization layers, respectively; and a set of tenth vias that extend between the third and fourth metallization layers, the set of tenth vias being in communication with the third portions of the third and fourth metallization layers.

13. The apparatus of claim 12, in which the alignment assembly further includes a plate having alignment openings formed therein.

14. The apparatus of claim 13, in which the waveguide is substantially rectangular.

* * * * *